(12) United States Patent
Murthy et al.

(10) Patent No.: US 7,158,923 B1
(45) Date of Patent: Jan. 2, 2007

(54) METHOD OF INTEGRATING PRODUCT INFORMATION MANAGEMENT WITH VEHICLE DESIGN

(75) Inventors: Krishna Murthy, Farmington Hills, MI (US); Michael E. Stoeckle, Canton, MI (US); Devang Desai, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 785 days.

(21) Appl. No.: 09/537,659

(22) Filed: Mar. 29, 2000

(51) Int. Cl.
G06G 7/48 (2006.01)
G06F 19/00 (2006.01)
G06F 17/00 (2006.01)
G06N 5/00 (2006.01)

(52) U.S. Cl. .................. 703/8; 703/3; 700/97; 706/45
(58) Field of Classification Search ................. 703/8, 703/3; 700/97; 706/45
See application file for complete search history.

(56) References Cited

U.S. PATENT DOCUMENTS

| | | |
|---|---|---|
| 4,696,225 A | 9/1987 | Weller |
| 4,882,692 A | 11/1989 | Saxton et al. |
| 4,912,657 A | 3/1990 | Saxton et al. |
| 5,031,111 A | 7/1991 | Chao et al. |
| 5,070,534 A | 12/1991 | Lascelles et al. |
| 5,111,413 A | 5/1992 | Lazansky et al. |
| 5,119,309 A | 6/1992 | Cavendish et al. |
| 5,197,120 A | 3/1993 | Saxton et al. |
| 5,291,748 A | 3/1994 | Ueda |
| 5,293,479 A | 3/1994 | Quintero et al. |
| 5,555,406 A * | 9/1996 | Nozawa ...................... 703/1 |
| 5,631,861 A | 5/1997 | Kramer |
| 5,754,738 A | 5/1998 | Saucedo et al. |
| 5,792,031 A | 8/1998 | Alton |
| 5,793,382 A | 8/1998 | Yerazunis et al. |
| 5,799,293 A | 8/1998 | Kaepp |
| 5,831,584 A | 11/1998 | Socks et al. |
| 5,846,086 A | 12/1998 | Bizzi et al. |
| 5,856,828 A | 1/1999 | Letcher, Jr. |
| 5,920,320 A | 7/1999 | Shimizu |
| 5,921,780 A | 7/1999 | Myers |
| 5,930,155 A | 7/1999 | Tohi et al. |
| 5,953,517 A | 9/1999 | Yin et al. |
| 5,963,891 A | 10/1999 | Walker et al. |
| 6,021,270 A | 2/2000 | Hanaki et al. |
| 6,036,345 A * | 3/2000 | Jannette et al. ............... 700/97 |

(Continued)

OTHER PUBLICATIONS

Artificial Intelligence (Understanding Computers), by Time-Life Books, 1986, ISBN 0-8094-5675-3, pp. 36-43.*

(Continued)

Primary Examiner—Paul Rodriguez
Assistant Examiner—Dwin M. Craig
(74) Attorney, Agent, or Firm—Gary Smith

(57) ABSTRACT

A method of integrating product information management with vehicle design includes the steps of selecting a vehicle program requirement from a library stored in a memory of a computer system, wherein the library is accessed through an information portal on the computer system. The method also includes the steps of selecting an information database containing information related to the design of the vehicle from the library, wherein the information database is accessed through the information portal, and determining if the information from the information database correlates with the program requirement. The method further includes the steps of using the information from the information database in the design of the vehicle, if the information from the information database correlates with the program requirement.

16 Claims, 3 Drawing Sheets

U.S. PATENT DOCUMENTS

| | | | |
|---|---|---|---|
| 6,037,945 | A | 3/2000 | Loveland |
| 6,084,590 | A | 7/2000 | Robotham et al. |
| 6,090,148 | A | 7/2000 | Weber et al. |
| 6,096,086 | A | 8/2000 | Weber et al. |
| 6,096,087 | A | 8/2000 | Weber et al. |
| 6,110,216 | A | 8/2000 | Weber et al. |
| 6,113,643 | A | 9/2000 | Weber et al. |
| 6,113,644 | A | 9/2000 | Weber et al. |
| 6,119,125 | A | 9/2000 | Gloudeman et al. |
| 6,209,794 | B1 | 4/2001 | Webster et al. |
| 6,253,167 | B1 | 6/2001 | Matsuda et al. |
| 6,273,724 | B1 | 8/2001 | Roytman |
| 6,307,576 | B1 | 10/2001 | Rosenfeld |
| 6,415,851 | B1 | 7/2002 | Hall et al. |
| 6,420,698 | B1 | 7/2002 | Dimsdale |
| 6,477,517 | B1 | 11/2002 | Limaiem et al. |
| 6,477,518 | B1 | 11/2002 | Li et al. |
| 6,482,082 | B1 | 11/2002 | Derleth et al. |
| 6,487,525 | B1 | 11/2002 | Hall et al. |
| 6,510,357 | B1 | 1/2003 | Naik et al. |
| 6,556,196 | B1 | 4/2003 | Blanz et al. |
| 6,577,308 | B1 | 6/2003 | Ohto et al. |
| 6,636,234 | B1 | 10/2003 | Endo et al. |
| 2002/0000996 | A1 | 1/2002 | Trika |
| 2002/0140633 | A1 | 10/2002 | Rafii et al. |
| 2003/0134676 | A1 | 7/2003 | Kang |

OTHER PUBLICATIONS

Juran on Quality by Design, by J. M. Juran, The Free Press, 1992, ISBN 0-02-916683-7, pp. 406-427 and 462-467.*

The Computer Science and Engineering Handbook, by Allen B. Tucker, CRC Press, ISBN: 0-8493-2909-4, 1996, p. 1954.*

SAE Recommended Practice, "Motor Vehicle Dimensions—SAE J11", Jun. 1993.

-"Interactive Graphics Package For Human Engineering And Layout Of Vehicle Workspace", Gerald F. Rabideau and James Farnady, Department of Systems Design, University of Waterlloo, Waterlloo, Ontario, Canada, 1976.

-"Simulation-Aided Design of Man/Machine Interfaces in Automated Industries", Gary I. Davis and James R. Buck, School of Industrial Engineering, Purdue University, West Lafayette, Indiana, 1981.

-"RAPID: Prototyping Control Panel Interfaces", Karl Freburger, OOPSLA '87 Proceedings, Oct. 4-8, 1987.

Lehner et al., "Distributed Virtual Reality: Supporting Remote Collaboration in Vehicle Design", IEEE 1997.

Purschke et al., "Virtual Reality-NewMethods for Improving and Accelerating the Development Process in Vehicle Styling and Design", IEEE 1998.

"The Introduction of Knowledge based Engineering for Design for Manufacture in the Automotive Industry", G.S. Wallace, Successful Cases of Integrated Product Design with Manufacturing Technology (Digest No: 1997/168), IEE Colloquium on, pp. 7/1-7/5, May 1997.

"Knowledge Based Total Product Engineering", A.P. Harper, Successful Cases of Integrated Product Design with Manufacturing Technology (Digest No: 1997/168), IEE Colloquium on, pp. 5/1-5/2, May 1997.

Lafon, "Solid Modeling With Constraints and Parameterised Features", IEEE, Jul. 1998.

Jinsong et al., "Parametric Design with Intelligence Configuration Analysis Mechanism", IEEE, Nov. 1993.

Mateos et al., "Parametric and Associative Design of Cartridges for Special Tools", IEEE 1995.

M. E. Gleason et al., "Automotive Climate Control Simulation Using CFD", Cray Channels, vol. 16, No. 2, 1994, pp. 4-7, XP008018557.

E. Augier, "Numerical and Experimental Study of Airflow In A HVAC Module", International Symposium on Automotive Technology and Automation, Jun. 3, 1996, pp. 59-66, XP008018546.

J. Currie, "Application of Computational Fluid Dynamics for the Optimization of Air Ducts", Isata 29th International Symposium on Automotive Technology and Automation, Proceedings of Conference on Supercomputer Applications in the Transportation Industries, Florence, Italy, Jun. 3-6, 1996, pp. 115-123, XP008021112 1996, Croydon, United Kingdom Automotive Autom, United Kingdom.

G. Anderson et al., "Computational Fluid Dynamics (CFD)", Engineering Designer, Mar.-Apr. 1997, Instn. Eng. Designers, United Kingdom, vol. 23, No. 2, pp. 16-17, XP008021114, ISSN: 0013-7898.

T. D. Hogg, "Rapid Prototyping Through Computational Fluid Dynamics (CFD)", Fifth International Conference on Factory 2000—The Technology Exploitation Process (Conf. Publ. No. 435), Cambridge, United Kingdom, Apr. 2-4, 1997, pp. 113-117, XP002252364 1997, London, United Kingdom, IEE, United Kingdom ISBN: 0-85296-682-2.

Seitz et al., "Toward Image-Based Scene Representation Using ViewMorphing", IEEE, 1996.

Singh et al., "Shape Recognition and Vision Based Robot Control By Shape Morphing", IEEE, 1999.

\* cited by examiner

METHOD OF INTEGRATING PRODUCT INFORMATION MANAGEMENT WITH VEHICLE DESIGN

BACKGROUND OF THE INVENTION

1. Field of the Invention

The present invention relates generally to vehicle design and, more specifically, to a method of integrating product information management with the design of a vehicle.

2. Description of the Related Art

Vehicle design, and in particular automotive vehicle design, is a complex process relying on the talents of individuals with specific skills. Vehicle design involves several overlapping phases, including design initiation, development, assessment and verification. Each of these phases relies on information in order to make a decision regarding the design. The information pertinent to the design of a vehicle may be available in various forms, such as individual knowledge based on previous experience. Other forms include newly generated data, or existing data stored within a computer database. For a system as complex as a vehicle, information may be stored in multiple computer databases. Frequently, the various computer databases are unrelated or maintained in incompatible formats. Access to and utilization of each of the databases by a user may require specialized knowledge or training, or multiple log-ins to access each database. Furthermore, a user may be unaware of the various databases and of the type of information available therein, to assist in the decision making process.

Information management provides for the systematic organization and delivery of information from various sources in a useful manner, to assist in decision making. In this example, information management is used in the design of a product, namely a vehicle. In the past, information delivery included the modification of the available information to suit the needs of the user, or to provide expert help to provide the information to the user in a useful manner. Information management has also focused on developing common naming conventions, processes and architectures to facilitate a systematic organization of information and cross-organization information transfer. Advantageously, access to the right information at the right time in the right format and with the right content can improve the quality and efficiency of a process, such as the vehicle design process. Thus, there is a need in the art for a method of integrating a product information management system with a vehicle design process to provide the user with centralized access to information in a predetermined manner to assist in informed decision-making.

SUMMARY OF THE INVENTION

Accordingly, the present invention is a method of integrating product information management with vehicle design. The method includes the steps of selecting a vehicle program requirement from a library stored in a memory of a computer system, wherein the library is accessed through an information portal on the computer system. The method also includes the steps of selecting an information database containing information related to the design of the vehicle from the library, wherein the information database is accessed through the information portal, and determining if the information from the information database correlates with the program requirement. The method further includes the steps of using the information from the information database in the design of the vehicle, if the information from the information database correlates with the program requirement.

One advantage of the present invention is that a method of integrating product information management with vehicle design is provided that links together various existing databases, system infrastructure and information sources to provide a user with access to information contained therein to assist the user in informed decision making. Another advantage of the present invention is that the method uses an information portal approach to provide a user with access to information in its original format and content. Still another advantage of the present invention is that the method provides for customization of the information portal by the user for a specific process. A further advantage of the present invention is that the method utilizes a process driven approach to supply information within an information portal window.

Other features and advantages of the present invention will be readily appreciated, as the same becomes better understood, after reading the subsequent description taken in conjunction with the accompanying drawings.

DESCRIPTION OF THE PREFERRED EMBODIMENT(S)

Vehicle design is achieved according to the present invention with a generic parametric driven design process. Advantageously, this process allows flexibility in vehicle design and engineering analysis of the vehicle design in a fraction of the time required using conventional design methods. Various computer-based tools are integrated to achieve this enormous time and expense savings, including solid modeling, parametric design, automated studies and a knowledge-based engineering library.

Figure 1:
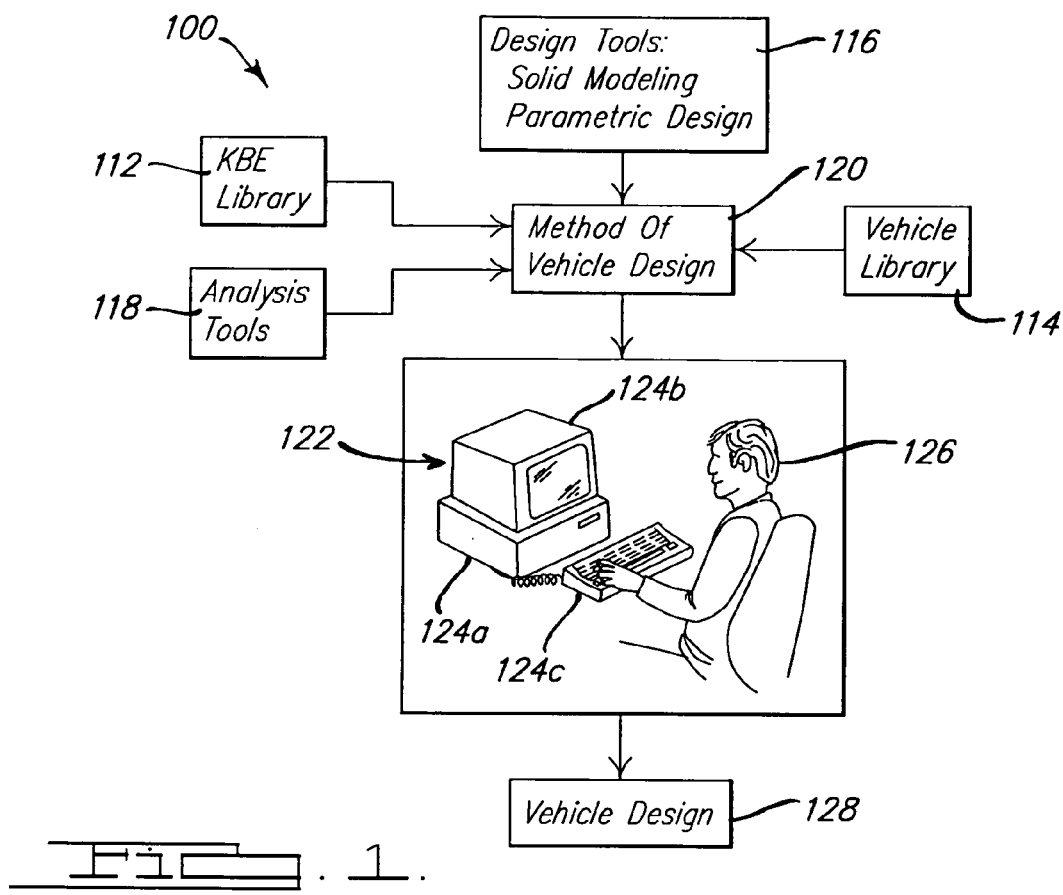
FIG. 1 is a block diagram of a system which may be utilized with a method of integrating product information management with vehicle design, according to the present invention.

Referring to the drawings and in particular FIG. 1, the tools 100 used by a method of integrating product information management with vehicle design, according to the present invention, are illustrated graphically. The tools 100 include a knowledge-based engineering library 112 stored on an electronic storage device (not shown) that is operatively connected to a computer system 122 to be described. The knowledge-based engineering library 112 is a database of sub-libraries containing an electronic representation of data including various experts' knowledge of information relevant to the design of a vehicle 10 to be described. The knowledge-based engineering library 112 may include information such as design, assembly and manufacturing rules and guidelines. The knowledge-based engineering library 112 may also contain data in electronic form regarding various types of vehicle subsystems. The knowledge-based engineering library 112 may further contain predetermined product assumptions regarding the vehicle 10 to be designed, such as model year, style, or production volume.

The knowledge-based engineering library 112 may include a sub-library, such as a component parts library of particular component parts used on a vehicle. The component parts sub-library may contain information such as a parametric solid model of a particular component part, as well as parameters defining attributes of the component part. A user 126 may select an attribute that is relevant to the design of the component part. For example, a relevant attribute may include a durability criterion.

The tools 100 also include a vehicle library 114 stored on the electronic storage device. The vehicle library 114 is an electrical representation of a vehicle model or a portion thereof. Advantageously, the vehicle library 114 may contain a parametric solid model of an exterior portion of a particular vehicle 10. In this example, the vehicle library 114 may include a parametric model of an exterior body portion of the vehicle 10. Also, the vehicle library 114 may contain parameters defining various vehicles and vehicle system characteristics, such as interior size and vehicle body style. It should be appreciated that the vehicle library 114 may be a sub-library of the knowledge-based engineering library 112.

The tools 100 may also include various computer-aided design (CAD) tools 116, which can be used by the method, to be described. These design tools 116 may include solid modeling, visualization and parametric design techniques. Solid modeling, for example, takes electronically stored vehicle model data from the vehicle library 114 and standard component parts data from the knowledge-based engineering library 112 and builds complex geometry for part-to-part or full assembly analysis. Several modeling programs are commercially available and generally known to those skilled in the art.

The parametric design technique is used in the electronic construction of vehicle geometry within the computer system 122, for designing the vehicle 10 or related component part. As a particular dimension or parameter is modified, the computer system 122 is instructed to regenerate a new vehicle or component part geometry.

The tools 100 also include various computer-aided engineering (CAE) analysis tools 118. One example of a CAE analysis tool 118 is computational fluid dynamics (CFD). Another example of a CAE analysis tool 118 is finite element analysis (FEA). Still another example of a CAE analysis tool 118 is an ergonomic study. Several software programs are commercially available to perform these analyses and are generally known to those skilled in the art.

The tools 100 further include the computer system 122, as is known in the art, to implement a method 120, according to the present invention to be described, of integrating product information management with vehicle design. The computer system 122 includes a processor and a memory 124a, which can provide a display of information for the design of a system, such as the vehicle 10, on a display device such as a video terminal 124b.

In this example, the information is displayed on the video terminal 124b in a series of screens, also referred to as a browser. Selection and control of the information within a screen can be achieved by the user 126, via a user interactive device 124c, such as a keyboard or a mouse. The user 126 inputs a set of parameters or a set of instructions into the computer system 122 when prompted to do so. The set of parameters or the set of instructions may be product specific, wherein other data and instructions non-specific to the product may already be stored in the memory 124a.

One example of an input method is a pop-up screen containing available information or instructions, including an on-line description for the parameter and a current value therefore. For example, information may be chosen from a table within a two-dimensional mode.

The computer system 122 utilizes the set of information or instructions from the user 126, and any other information regarding related vehicle systems and information from the libraries 112, 114, design tools 116 and analysis tools 118, for a method 120, according to the present invention discussed in detail subsequently, of providing information to users that enhances informed decision making in the design of the vehicle 10.

Advantageously, the computer implemented method of integrating product information management with vehicle design, to be described, combines all of the foregoing to provide an efficient, flexible, rapid tool for making an informed decision regarding the design of the vehicle 10. Further, an informed decision regarding the vehicle design 128 is an output of the method 120 and the vehicle design 128 is available for further analysis and study.

Figure 2:
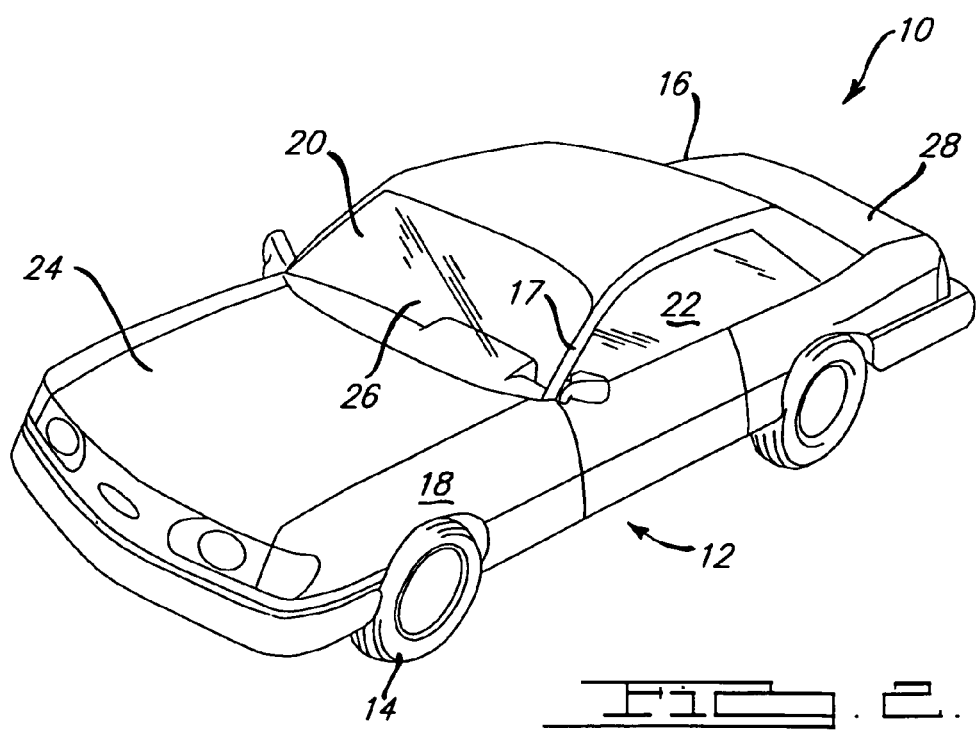
FIG. 2 is a perspective view of a vehicle.

Referring to FIG. 2, a vehicle 10, and in particular an automotive vehicle, is illustrated. The vehicle 10 includes a vehicle frame, generally indicated at 12, which supports a vehicle body 16. The vehicle 10 also includes a front axle (not shown) and rear axle (not shown) disposed in a spaced relationship to one another and extending substantially transverse to a longitudinal axis of the vehicle 10. It should be appreciated that wheels 14, as is known in the art, are operatively mounted to the front axle and rear axle, for rolling engagement with a surface such as a road.

The vehicle 10 also includes a vehicle body 16 which defines the shape of the vehicle 10, as is known in the art, and includes components typically associated with the vehicle body 16. The vehicle body 16 is supported by the frame 12. The vehicle body 16 includes structural members 17 which form a load bearing surface for the vehicle 10. The vehicle body 16 includes a plurality of generally planar interconnected body panels 18 secured thereto using a conventional means such as welding or fastening. Advantageously, the body panels 18 further define an aesthetically pleasing shape of the vehicle 10. The vehicle body 16 may include a windshield 20, and other windows 22, as is known in the art.

The vehicle body 16 defines a front storage compartment 24 referred to as the engine compartment, which forms the general shape of the front of the vehicle 10. The engine compartment houses the powertrain system (not shown) for the vehicle 10. The vehicle body 16 further defines an occupant compartment 26 to accommodate vehicle occupants (not shown). The occupant compartment 26 includes a number of seats (not shown) for the occupants and control mechanisms (not shown) to operate the vehicle 10. The vehicle body 16 also defines a rear storage compartment 28, as is known in the art, forming the shape of the rear of the vehicle 10.

The vehicle 10 includes a powertrain system that propels the vehicle 10. The vehicle 10 includes a heat engine (not shown) operatively coupled to a transmission (not shown), as is known in the art. The transmission transmits engine rotation and power to a drive wheel 14. The transmission enables the vehicle 10 to accelerate over its speed range through predetermined gear ratios, while the engine functions within a predetermined operating range. It should be appreciated that the engine and transmission are in communication with a powertrain controller (not shown) that manages and controls their operation. Preferably, the vehicle 10 includes other systems such as a thermal management system (not shown), or a chassis system (not shown), which is conventional and well known in the art to operate the vehicle 10.

Figure 3:
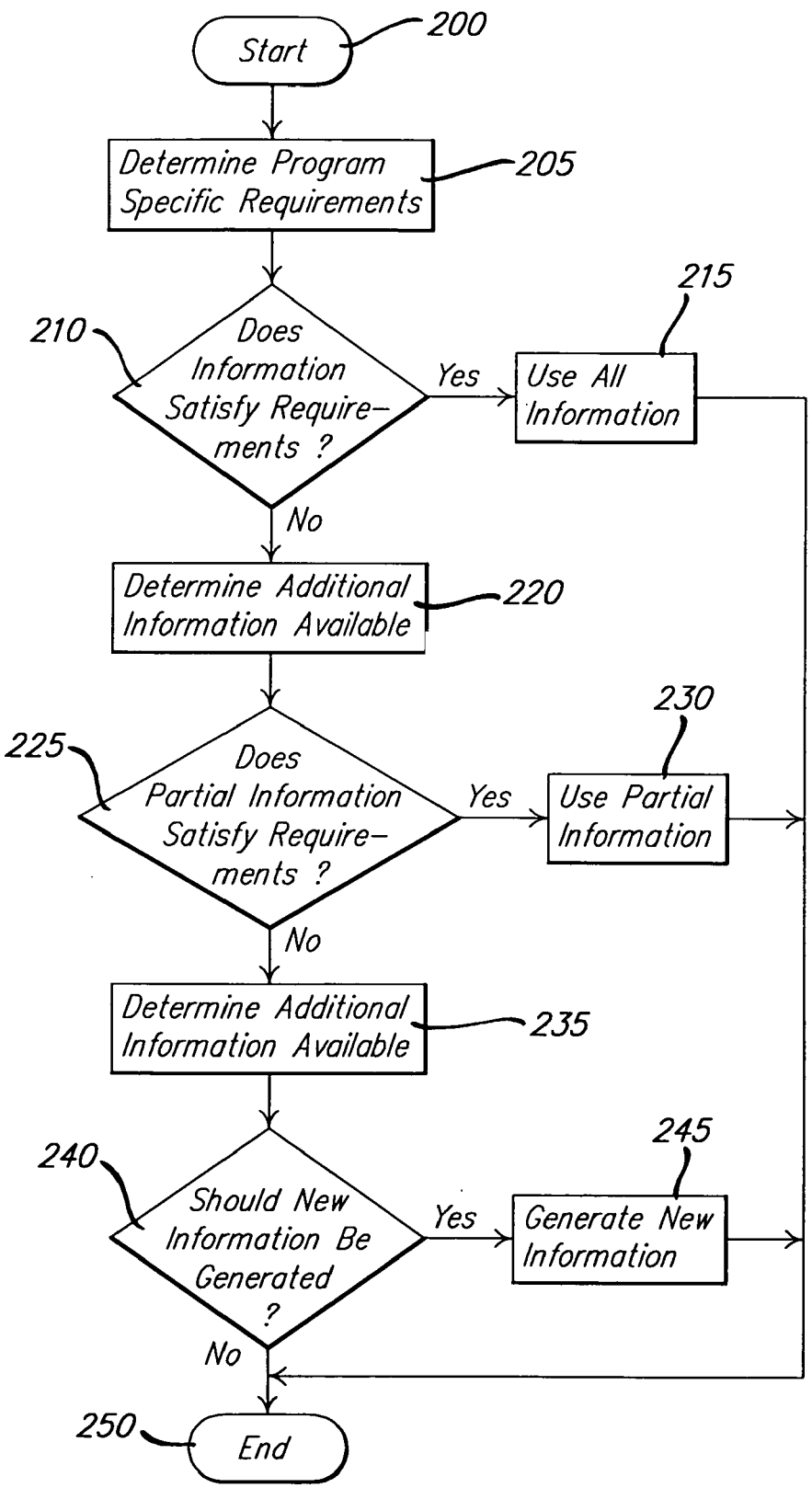
FIG. 3 is a flowchart of a method of integrating product information management with vehicle design, according to the present invention, for the vehicle of FIG. 2.

Referring to FIG. 3, flowchart of a method, according to the present invention, of integrating product information management with vehicle design is illustrated. Advantageously, product information management makes data and information from a variety of sources available through a common source, and provides for delivery of the information to the user 126 for use in critical product decision making.

The methodology begins in bubble 200 and advances to block 205. Advantageously, the method utilizes a web-enabled portal process to provide the user 126 with information in its original format and content to use in the design of the vehicle 10. As is known in the art, an information portal is a web site that provides a particular audience with access to diverse sets of information organized in a specific manner. It should be appreciated that the information portal may contain a series of screens that leads the user 126 step by step through a decision making process and provides the appropriate information to the user 126 at the right time. The user 126 can be linked with other experts through an information portal screen to assist in the underlying engineering process. In this example, the information portal is organized into screens that provide the user 126 with information to make an informed decision relating to the vehicle design 128 of the vehicle 10. Examples of the type of information relevant to vehicle design 128 include warranty, product design data and manufacturing data. Advantageously, the method utilizes a web-based portal process to provide the user 126 with information in its original format and content to use in the vehicle design 128 of the vehicle 10.

Advantageously, the information portal can also be customized for a particular user 126. For example, different users 126 may utilize the same information databases within the knowledge-based engineering library 112, but at different stages within the vehicle design process. If a user 126 repeatedly performs a set of operations, a macro-type customization, as is known in the art, can be developed and the information portal can be personalized to present only the resulting information, in order to improve data processing and overall business efficiency.

In block 205, the user 126 determines specific program requirements related to the vehicle design 128 of the vehicle 10 and selects an information database for decision making purposes from an information portal displayed on the video terminal 124b. An example of a program requirement is information maintained within the knowledge-based library 112 regarding the type of vehicle 10 to be designed, such as passenger car or truck. Another example of a program requirement is anticipated production volume, or vehicle body style. Still another example of a program requirement is a warranty target. Advantageously, the user 126 may select a program requirement from an information portal screen displayed on the display terminal 124b containing a list of program requirements. The user 126 may also select an information database related to making an informed decision regarding the vehicle design 128 of the vehicle 10 from the information portal screen. The information database is a compilation of existing information maintained within a database in the knowledge-based engineering library 112. For example, the information may be existing data from a previously conducted vehicle test procedure. The methodology advances to diamond 210.

In diamond 210, the methodology determines if the information from the information database correlates with the program requirements. For example, the information may be compared to the program requirements to determine if there is a change in a component part that would affect the use of the information in making an informed decision regarding the vehicle design 128. The information may also be compared to the program requirements to determine if there is a design or manufacturing process change that would affect the use of the information. The information may further be compared to the program requirements to determine if there is a field issue or a change in customer expectation that would affect its use. If the information does satisfy the program requirements, the methodology advances to block 215.

In block 215, the methodology uses the information from the information database in making an informed decision regarding the design of the vehicle 10. The methodology advances to block 250, to be described. Returning to block 210, if the information does not correlate with the program requirements, the methodology advances to block 220.

In block 220, the user 126 determines if additional information from another database is available to assist in determining if the information database correlates with the program requirements. In this example, the various other information sources are displayed in another information portal screen on the display terminal 124b. The additional information may be data regarding field issues or changes in customer expectations, significant design or manufacturing process changes, changes to other components or impacts on the other components. The methodology advances to diamond 225.

In diamond 225, the user 126 determines if a portion of the information from the information database correlates with the program requirements in light of the additional information available through the information portal screen. For example, the user 126 may access a database to review conditions under which the information was generated to determine if a portion of the information correlates with the program requirements. The user 126 may also access a database to determine if criteria exist to determine if a portion of the information will correlate with the specific program requirements. If a portion of the information will correlate with the specific program requirements, the methodology advances to block 230. In block 230, the user 126 uses the portion of the information from the information database that satisfies the specific program requirements for informed decision-making regarding the vehicle design 128 of the vehicle 10. The methodology advances to bubble 250, to be described.

Returning to diamond 225, if the portion of the information does not satisfy the predetermined requirements in light of the additional information, the methodology advances to block 235. In block 235, the user 126 determines through the information portal if still more information is available from still another database within the knowledge-based engineering library 112 to assist in determining if a portion of the information from the information database correlates with the program requirements. The methodology advances to diamond 240.

In diamond 240, the user 126 determines through the additional information displayed on the information portal whether to generate new information pertaining to the vehicle design 128 of the vehicle 10 based on the available additional information. For example, the user 126 may decide to perform a task such as a laboratory test, since existing test information or a portion thereof is not reusable.

If the user 126 decides to generate new information, the methodology advances to block 245. In block 245, the user 126 generates new information. For example, the user 126 may decide whether to perform a test on either an actual vehicle or in a laboratory. The methodology advances to bubble 250 and ends. Returning to diamond 240, if the user 126 determines not to generate new information, the methodology advances to bubble 250 and ends.

Figure 4:
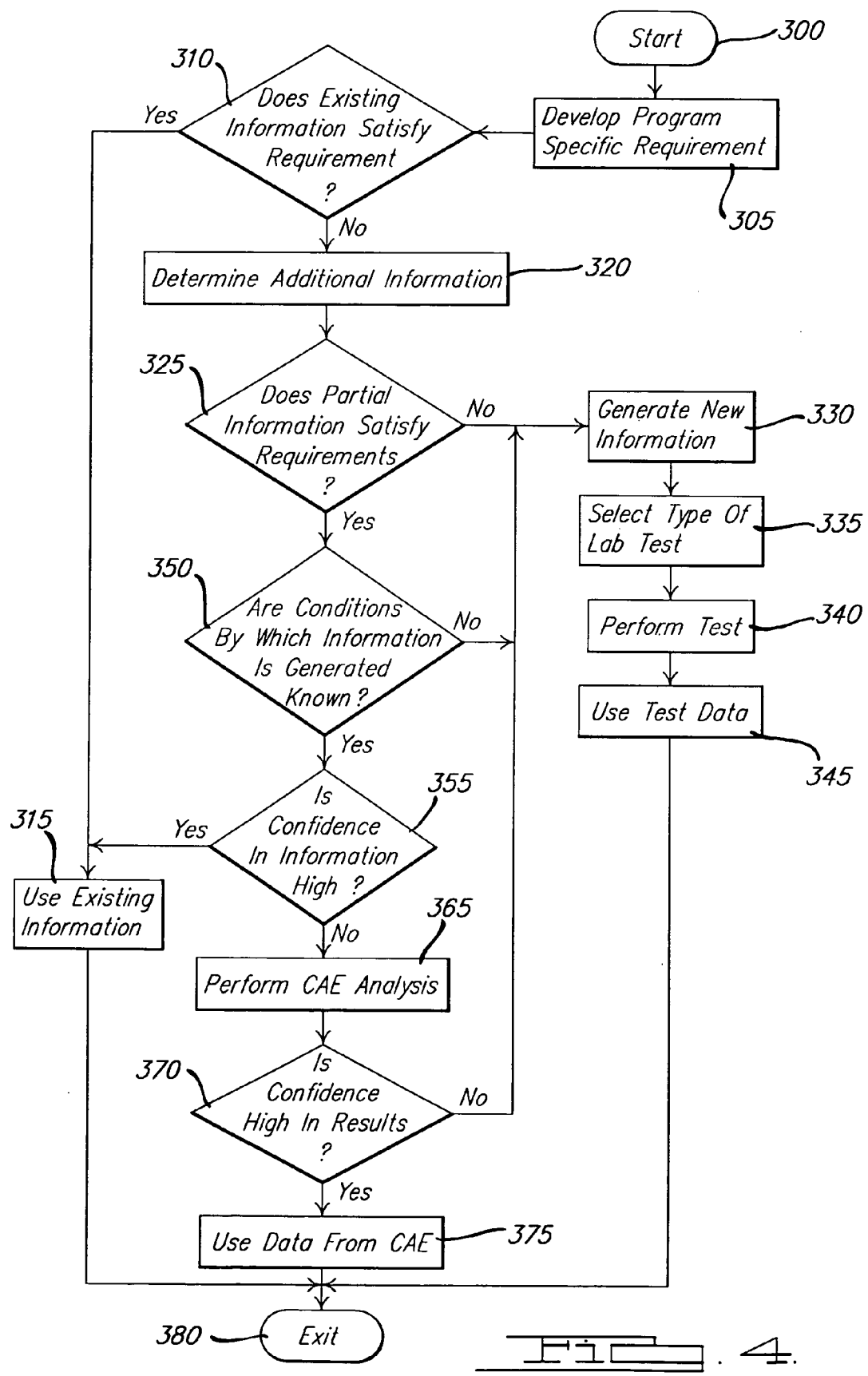
FIG. 4 is a flowchart of another embodiment of a method of integrating product information management with vehicle design, according to the present invention.

Referring to FIG. 4, another embodiment, according to the present invention, of a method of integrating product information management with vehicle design is illustrated. In this embodiment, the method is utilized for making a decision regarding existing verified information, for use in the vehicle design 128 of the vehicle 10. Advantageously, an information verification process determines if previously verified information or data can be reused in the current vehicle design, to save time and cost and improve product quality. An example of previously verified data is vehicle test data. The method begins in bubble 300 and continues to block 305.

In block 305, the user 126 determines through an information portal screen displayed on the video terminal 124b, specific program requirements maintained in the knowledge-based engineering library 112 that are applicable to the vehicle design 128 of the vehicle 10. An example of a program specific durability target for a component part is 200,000 miles. In this example, selecting a durability guideline program requirement from the information portal screen will access a durability guideline maintained in a knowledge-based engineering library 112. The user 126 also uses the information portal screen to select an information database from the knowledge-based engineering library 112 that is related to the vehicle design 128 of the vehicle 10. In this example, the information database is a durability information database containing verified durability test data. The methodology advances to block 310.

In diamond 310, the user 126 determines through the information portal screen if the existing durability information correlates with the program requirements. For example, the existing durability information may be in the form of test data. If the existing durability information satisfies the program requirements, the methodology advances to block 315.

In block 315, the user 126 reuses the verified durability information in informed decision making regarding the vehicle design 128 of the vehicle 10 since it satisfies the specified program requirements. The methodology advances to bubble 380 and ends.

Returning to diamond 310, if the existing durability information does not correlate with the specific program requirements, the methodology advances to block 320. In block 320, the user 126 determines through the information portal screen if additional information is available that may influence the reuse of existing durability information in the verification process. For example, the user 126 may locate a durability target for a subsystem of the vehicle 10. The methodology advances to diamond 325.

In diamond 325, the user 126 determines through the information portal if a portion of the existing durability information may be reused based on the additional information. If a portion of the durability information may not be reused, the methodology advances to block 330. In block 330, the user 126 generates new information. For example, the user 126 may perform a test to generate new data for use in the vehicle design 128 of the vehicle 10. The methodology advances to block 335 and the user 126, through the information portal screen, selects the type of test to be performed to generate new data. One example of a test is an evaluation in a laboratory using a test stand. Another example of a test is an on-road evaluation using a vehicle 10. The methodology advances to block 340.

In block 340, the selected test is performed to generate new data. The methodology advances to block 345. In block 345, the methodology uses the newly generated information in the vehicle design 128 of the vehicle 10. The methodology advances to bubble 380 and ends.

Returning to diamond 325, if a portion of the information does satisfy a predetermined requirement, the methodology advances to diamond 350. In diamond 350, the user 126 determines through the information provided through the information portal if conditions are known under which the existing durability data was generated. Advantageously, additional information from still another information database within the knowledge-based engineering library 112, such as noise criteria, may be utilized in further partitioning the data. If the conditions are not known, than the methodology advances to diamond 330 and continues.

Returning to diamond 350, if the conditions are known, the methodology advances to diamond 355. In diamond 355, the user 126 determines through additional information provided in the information portal screen if the degree of confidence in the existing verified data meets a predetermined criteria. For example, the user 126 may perform a computer-aided engineering (CAE) analysis to determine the degree of confidence in the existing data. If the degree of confidence does meet the predetermined criteria, the methodology advances to block 315 and continues. Returning to diamond 355, if the degree of confidence does not meet the predetermined criteria, the user 126 advances to block 365. In block 365, the user 126 performs a test such as a computer-aided engineering analysis 118 to verify the use of the reuse data. The methodology advances to block 370.

In diamond 370, the user 126 determines through still more information in the information portal if confidence in the results of the CAE analysis 118 meets a predetermined criteria. If confidence in the results of the CAE analysis 118 does not meet a predetermined criteria, the methodology advances to diamond 330 and continues. Returning to diamond 370, if confidence in the results of the CAE analysis 118 does meet a predetermined criteria, the methodology advances to block 375. In block 375, the methodology uses the results of the CAE analysis 118 and a portion of the verification information in informed decision-making regarding the vehicle design 128 of the vehicle 10. The methodology advances to bubble 380 and ends.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method of integrating product information management with vehicle design, said method comprising the steps of selecting a vehicle program requirement from a library stored in a memory of a computer system, wherein the library is accessed through an information portal on the computer system;

selecting an information database containing information related to the design of the vehicle from the library, wherein the information database is accessed through the information portal;

determining if the information from the information database correlates with the program requirement; and using the information from the information database in the design of the vehicle, if the information from the information database correlates with the program requirement.

2. A method as set forth in claim 1 including the step of selecting through the information portal additional information from an additional information database for determining if the information from the information database correlates with the program requirement, if the information from the information database does not correlate with the program requirement.

3. A method as set forth in claim 2 including the step of determining if a portion of the information from the information database correlates with the program requirement based on the additional information.

4. A method as set forth in claim 3 including the step of using the portion of the information from the information database that correlates with the program requirement in the design of the vehicle, if a portion of the information from the information database correlates with the program requirement.

5. A method as set forth in claim 4 including the step of selecting through the information portal additional information regarding the design of the vehicle.

6. A method as set forth in claim 5 including the step of using the additional information to determine whether to generate new information for use in the design of the vehicle and generating new information if determined that the new information should be generated.

7. A method of integrating product information management with vehicle design, said method comprising the steps of:

selecting a vehicle program requirement from a library stored in a memory of a computer system, wherein the library is accessed through a web-based information portal on the computer system;

selecting an information database containing information related to the design of the vehicle from the library, wherein the information database is accessed through the information portal;

determining if the information from the information database correlates with the program requirement;

using the information from the information database in the design of the vehicle, if the information from the information database correlates with the program requirement;

selecting through the information portal additional information for determining if the information from the information database correlates with the program requirement, if the information from the information database does not correlate with the program requirement;

determining if a portion of the information from the information database correlates with the program requirement based on the additional information; and using the portion of the information from the information database that correlates with the program requirement in the design of the vehicle.

8. A method as set forth in claim 7 including the step of selecting through the information portal additional information regarding the design of the vehicle.

9. A method as set forth in claim 8 including the step of using the additional information to determine whether to generate new information for use in the design of the vehicle and generating new information if determined that the new information should be generated.

10. A method of integrating product information management with vehicle design to verify existing information, using a computer system having a memory, a display device and a user interactive device, said method comprising the steps of:

selecting a vehicle program requirement for the design of the vehicle from a library stored in a memory of the computer system, wherein the library is accessed through a web-based information portal displayed on the display device;

selecting an information database of verification information for the design of the vehicle, wherein the information database is accessed through the information portal;

determining if the verification information from the information database correlates with the program requirement;

using the information database in the design of the vehicle if the verification information correlates with the program requirement;

selecting through the information portal additional information regarding the design of the vehicle;

using the additional information to determine if a portion of the verification information correlates with the program requirement;

using the portion of the verification information that correlates with the program requirement if determined that a portion of the verification information correlates with the program requirement; and generating new information if a portion of the verification information does not correlate with the program requirement.

11. A method as set forth in claim 10 including the step of determining through the information portal if a condition is known by which the verification information was generated, if a portion of the verification information correlates with the program requirement.

12. A method as set forth in claim 11 including the step of generating new verification information if the condition by which the verification information was generated is not known and using the new verification information in the design of the vehicle.

13. A method as set forth in claim 11 including the step of determining confidence in the portion of the verification information that correlates with the program requirement if the condition by which the verification information is generated is known.

14. A method as set forth in claim 13 including the step of performing a computer-aided engineering analysis of the verification information if not confident in the verification information.

15. A method as set forth in claim 14 including the step of using the portion of the verification information and the results of the computer-aided engineering analysis in the design of the vehicle if confident in the computer-aided engineering analysis.

16. A method as set forth in claim 13 including the step of using the portion of the verification information in the design of the vehicle if confident in the verification information.

* * * * *